United States Patent [19]

Shingo

[11] Patent Number: 5,892,896
[45] Date of Patent: Apr. 6, 1999

[54] COMPUTER SYSTEM INCLUDING MEMORY AND METHOD FOR DISCONNECTING MEMORY CARD HAVING PREDETERMINED FAULT

[75] Inventor: Miki Shingo, Tokyo, Japan

[73] Assignee: NEC Corporation, Tokyo, Japan

[21] Appl. No.: 748,656

[22] Filed: Nov. 15, 1996

[30] Foreign Application Priority Data

Nov. 21, 1995 [JP] Japan ................................. 7-302399

[51] Int. Cl.$^6$ ................................................ G06F 11/20
[52] U.S. Cl. ................................ 395/182.06; 395/185.01
[58] Field of Search ........................ 395/182.03, 183.18, 395/183.06, 185.01, 185.07, 182.06; 364/266.2; 371/21.6, 10.2; 711/115

[56] References Cited

U.S. PATENT DOCUMENTS

| | | | |
|---|---|---|---|
| 4,209,846 | 6/1980 | Seppa | 364/900 |
| 4,535,455 | 8/1985 | Peterson | 395/185.01 |
| 4,875,209 | 10/1989 | Mathewes, Jr. et al. | 371/3 |
| 4,964,130 | 10/1990 | Bowden, III et al. | 371/40.2 |
| 5,220,567 | 6/1993 | Dooley et al. | 371/5.1 |
| 5,263,032 | 11/1993 | Porter et al. | 371/40.2 |
| 5,410,545 | 4/1995 | Porter et al. | 371/21.6 |
| 5,502,814 | 3/1996 | Yuuki et al. | 395/183.18 |
| 5,511,164 | 4/1996 | Brunmeier et al. | 395/185.07 |
| 5,577,194 | 11/1996 | Wells et al. | 395/182.06 |

OTHER PUBLICATIONS

Microsoft Press, Computer Dictionary, p. 12.

*Primary Examiner*—Robert B. Beausoliel, Jr.
*Assistant Examiner*—Scott T. Badesman
*Attorney, Agent, or Firm*—McGinn & Gibb, P.C.

[57] ABSTRACT

When an error occurs in a memory card of a computer system, error information having an error occurrence time, a number of a memory card in which the error has occurred, and an error status are sequentially stored as the error history information in a random access memory (RAM) connected to a system bus in the computer system. A number of errors of the memory card on which the error has occurred and an interval between the errors are calculated based on the error history information. When the calculation results deviate from each predetermined value, the memory card is deleted (e.g., disconnected from a memory board of the computer system) as having an intermittent fault or a high frequency of fault occurrence. During access to the memory, by referring to an address decode register, a memory card number is identified from the most-significant portion of the address.

13 Claims, 4 Drawing Sheets

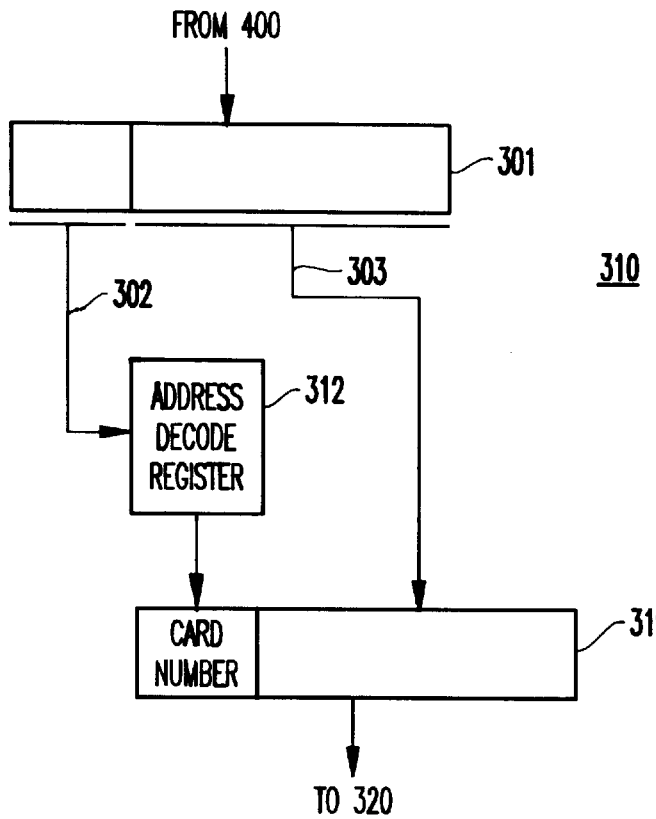
FIG. 2
| ERROR OCCURRENCE TIME | CARD NUMBER ERROR OCCURRED | ERROR STATUS |
|---|---|---|
| 951201030303 | 7 | 1-BIT ERROR CORRECTED |
| 951202110033 | 3 | TIME OUT |
| ⋮ | ⋮ | ⋮ |
FIG. 3
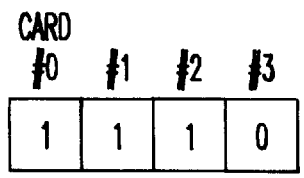
0 : NON-INSTALLED
1 : INSTALLED
FIG. 4

COMPUTER SYSTEM INCLUDING MEMORY AND METHOD FOR DISCONNECTING MEMORY CARD HAVING PREDETERMINED FAULT

BACKGROUND OF THE INVENTION

The present invention relates to a memory and method in a computer system, and more particularly to a memory board and method which deletes (e.g., disconnects) a memory card upon, for example, an intermittent fault and/or a non-fatal fault.

In a conventional memory, a memory block is separated by detecting an error due to a fixed fault of a memory. In the conventional memory, an access to the separated memory block is prevented by registering a column address and a row number of the separated block in a delete column address register and a delete row address register.

In the conventional memory, a fault in a memory block is detected by one of checking a memory block during system start-up and a parity check during system operation. Therefore, a fault can be detected by these checks if the fault is a fixed fault. On the other hand, when a fault is an intermittent fault, the operation can be continued as long as a fault is not detected by checking.

With respect to contents of a fault, when an error due to a fault has a plurality of bit errors (e.g., errors in two or more bits) simultaneously, they are processed as a fault which cannot be recovered and are thus fatal. However, when a fault error has one bit error, an operation can be continued even if it is not processed as a fatal error because recovery is possible.

However, if an error is detected frequently, system reliability may be poor even if the error is due to an intermittent fault. The memory having an intermittent fault which is detected frequently may eventually cause a fatal fault even if the memory initially does not have a fatal fault. Thus, the memory lowers system reliability and requires time for recovering the fault (e.g., correcting the error), thereby deteriorating the system performance.

SUMMARY OF THE INVENTION

In view of the foregoing problem of the conventional memory, an object of the present invention is to improve a system reliability by deleting (e.g., disconnecting) a memory portion having a fault that is one of intermittent and non-fatal. It is another object of the invention to improve the system performance by avoiding a fault recovery of such intermittent and non-fatal errors by an error correction process.

In a memory system according to a first aspect of the present invention, a memory has at least one memory portion and at least one memory controller. The memory controller controls access to the at least one memory portion. Each of the memory portions is connected to one of the memory controllers. A memory portion is deleted (e.g., disconnected) if the memory portion has at least one of an intermittent fault and a non-fatal fault having a predetermined frequency.

With the unique and unobvious structure of the present invention, system reliability and performance are improved.

BRIEF DESCRIPTION OF THE DRAWINGS

The above-mentioned and other objects, features and advantages of this invention will become more apparent by reference to the following detailed description of the invention taken in conjunction with the accompanying drawings in which:

FIG. 2 is a block diagram showing the configuration of a memory controller 310 according to the first embodiment of the present invention;

FIG. 3 shows a content of an error history information stored in a RAM 200;

FIG. 4 shows a content of a memory installation information stored in the RAM 200;

DETAILED DESCRIPTION OF THE PREFERRED EMBODIMENTS

A memory in a computer system in accordance with preferred embodiments of the present invention will be described in detail with reference to the accompanying drawings.

Figure 1:
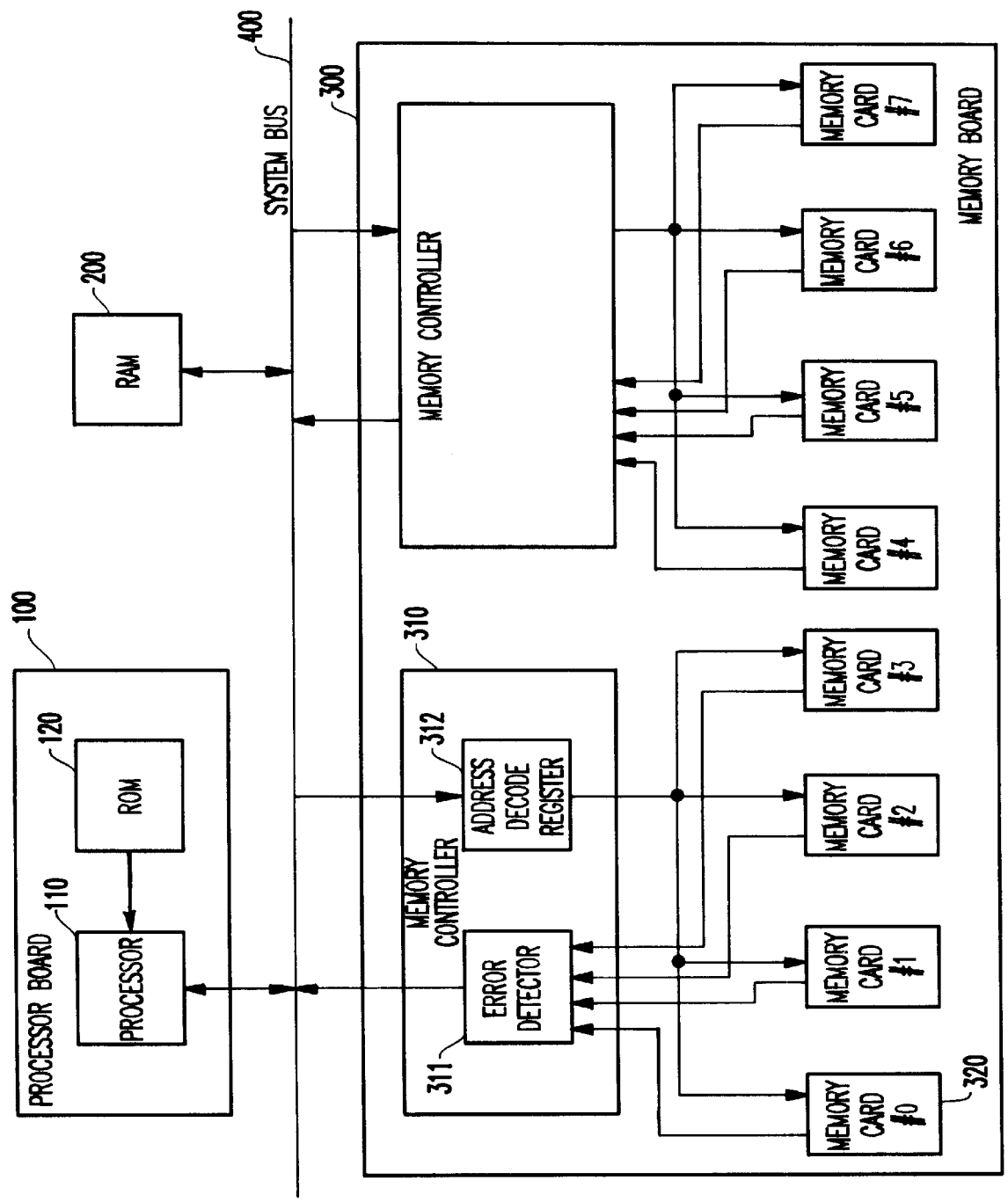
FIG. 1 is a block diagram showing the configuration of a computer system having a memory according to a first embodiment of the present invention.

Referring to FIG. 1, a computer system according to a first embodiment of the present invention includes a processor board 100 (as a processing unit) having a processor 110, a memory board 300 as a main storage, a RAM 200 which is preferably a non-volatile memory, and a system bus 400 connecting the processor board 100, the memory board 300, and the RAM 200.

The processor board 100 includes a ROM 120 storing various programs for memory control. These programs include a memory installation check program for checking whether the memory card is installed (mounted) on the memory board 300, a memory error analytical program for analyzing the state of a memory error, a memory reduction control program for changing an installation state of the memory in accordance with the memory error state, and a memory restructuring program for changing the correspondence of addresses and the memory cards, etc.

The memory board 300 includes at least one memory controller 310, and at least one memory card 320 which is connected to the memory controller 310. For example, four memory cards 320 are connected to each of the two memory controllers 310 in the configuration of FIG. 1. Obviously, other connection configurations would be known to one of ordinary skill in the art within the purview of the present application. Identification numbers from #0 to #7 are provided for the respective memory cards 320.

The memory controller 310 is provided with an error detector 311 for detecting an error on the memory card 320, and an address decode register 312 for judging a memory card to which an access should be made according to an address supplied from the system bus 400. An address decode register 312 detects an access to a memory area in which no memory card is installed, and a detection result is supplied to the error detector 311.

Referring to FIG. 2, the address decode register 312 includes a plurality of words, and each word stores a corresponding memory card number. An address 301 from the system bus 400 includes a most-significant portion 302 and a least-significant portion 303. The least-significant portion 303 is used in each memory card 320 for the memory access. The most-significant portion 302 is used for indexing the address decode register 312. That is, the most-significant portion 302 is translated to a card number via the address decode register 312.

For example, when a size of one memory card is 16 MB, the least-significant 6 digits (in the hexadecimal notation) correspond to the least-significant portion 303, while the remaining part corresponds to the most-significant portion 302. If the most-significant portion 302 indicates "0", a first word (addressed as "0") in the address decode register 312 is referenced. In contrast if the most-significant portion indicates "1", a second word (addressed as "1") in the address decode register 312 is referenced. The referenced word in the address decode register 312 represents a memory card number to which an access should be made. Generally, the address decode register 312 stores a corresponding memory card number. However, register 312 may store a number that is not used as a memory area when a memory card is not installed in a memory area, thus representing a "non-installed" state.

In other configurations, the address decode register 312 may be installed as an independent register, or may be assigned to a part of a memory area.

The RAM 200 may have a power storage cell (e.g., batteries) to maintain its content when an external power supply is turned off unexpectedly. The RAM 200 stores error history information holding a history of memory errors and memory installation information indicating the installation state of the memory cards 320.

Referring to FIG. 3, the error history information stored in a RAM 200 has error information corresponding to each occurred error. The error information includes, for example, an error occurrence time at which an error has occurred, a card number of a memory card on which the error has occurred, and an error status of the occurred error.

An example of the error history information illustrated in FIG. 3 shows that a one-bit error occurred in a card number "#7" at 3:03:03 AM on Dec. 1, 1995, and has been corrected. Second, a time-out occurred in a card number "#3" at 11:00:33 AM on Dec. 2, 1995.

Referring to FIG. 4, the memory installation information indicates "1" when a corresponding memory card is installed, and indicates "0" when a corresponding memory card is not installed. Although one field is used for each card in the example illustrated in FIG. 4, one field can be used for every two cards for memory reduction purposes.

Hereinbelow and referring to FIGS. 1, 5, and 6, the memory reduction operation in accordance with the above-mentioned embodiment of the present invention will be described.

Figure 5:
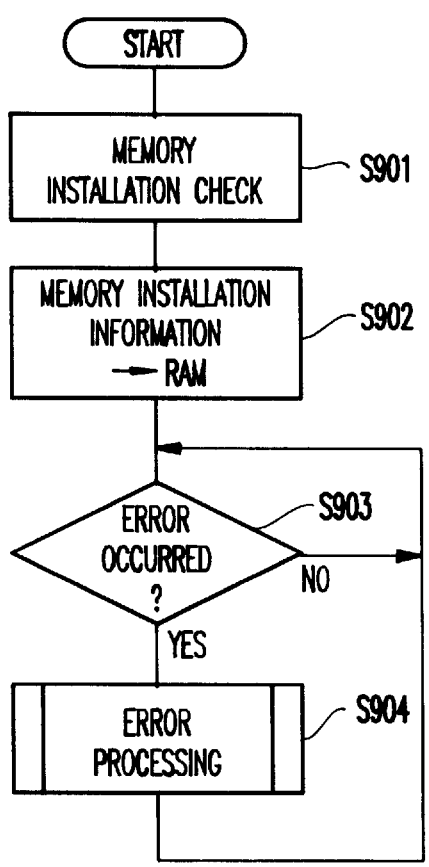
FIG. 5 is a flowchart showing the entire operation of the computer system according to the first embodiment of the present invention.

Referring to FIG. 5, the memory installation check is performed at a system start-up so that information representing which memory card is installed can be obtained (step S901). The information on the memory installation is set as the memory installation information in the RAM 200 (step S902).

After setting the memory installation information, when an error occurs on the memory card 320 during operation, the processor 110 is informed of the error by the error detector 311. The address decode register 312 detects an access to an address area in which no memory card is installed, and this information is similarly supplied to the processor 110 through the error detector 311. When the processor 110 is informed of the error (step S903), the processor 110 carries out the operation shown in FIG. 6 as the error processing operation (S910).

Figure 6:
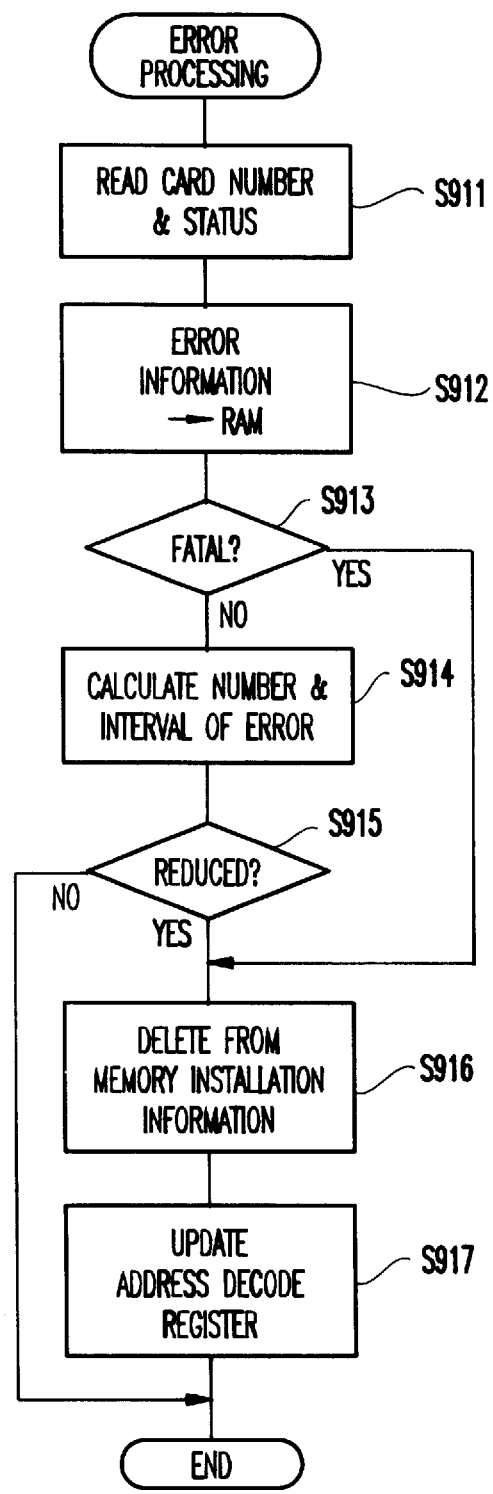
FIG. 6 is a flowchart showing the operation of an error processing in the computer system according to the first embodiment of the present invention.

Referring to FIG. 6, the processor 110 receives the card number of the memory card 320 on which the error occurred and the status of the error from the error detector 311 (step S911), and adds the card number and status to the error history information in the RAM 200 as the error information (step S912).

The processor 110 judges whether the generated error is fatal (step S913). Here, the fatal error represents an error which cannot be recovered or is difficult to recover without numerous processing steps or lengthy processing time. For example, a two-bit error or an error detected as a time-out corresponds to a fatal error. On the other hand, a one-bit error or the like can be usually recovered, and it cannot be hence regarded as a fatal error as long as its recovery is possible.

When the error is judged to be fatal in the step S913, a field of a corresponding memory card in the memory installation information in the RAM 200 is set to "0" so that the memory card is deleted (e.g., disconnected) (step S916). The setting of the address decode register 312 is then changed for restructuring register 312 (e.g., changing its configuration) to prevent access to the deleted memory card (step S917). This operation reduces the memory required.

Meanwhile, when the error is judged not to be fatal at the step S913, a number of errors concerning that memory card and/or a time interval between a current error and a previous error are calculated by referring to the error history information in the RAM 200 (step S914). As a result of calculation, if a number of errors is greater than a predetermined value and/or if a time interval between the errors is smaller than a predetermined value, the frequency of occurrence of the fault is considered to be high and that memory is deleted (disconnected) from the memory board 300 (step S915). That is, similarly to the fatal error, the field of a corresponding memory card in the memory installation information in the RAM 200 is set to "0" (step S916), and the setting of the address decode register 312 is changed to restructure the memory (step S917).

Although the entire processing has been described above, the steps S901 and S902 may be performed by the installation check program, the steps S911 and S912 may be performed by the memory error analytical program, the steps S913 and S916 may be performed by the memory reduction control program, and the step S917 may be performed by the memory restructuring program.

In the computer system according to the first embodiment of the present invention, since the memory card on which the intermittent fault has occurred or the memory card having a high frequency of errors that are non-fatal can be deleted (disconnected) by the address decode register 312 by referring to the error history information in the RAM 200, system reliability can be improved. Further, such a memory card fault can be prevented from being subjected to recovery (e.g., error correction), thus improving the system performance.

Next, a second embodiment of the present invention will be described with reference to the drawings.

Figure 7:
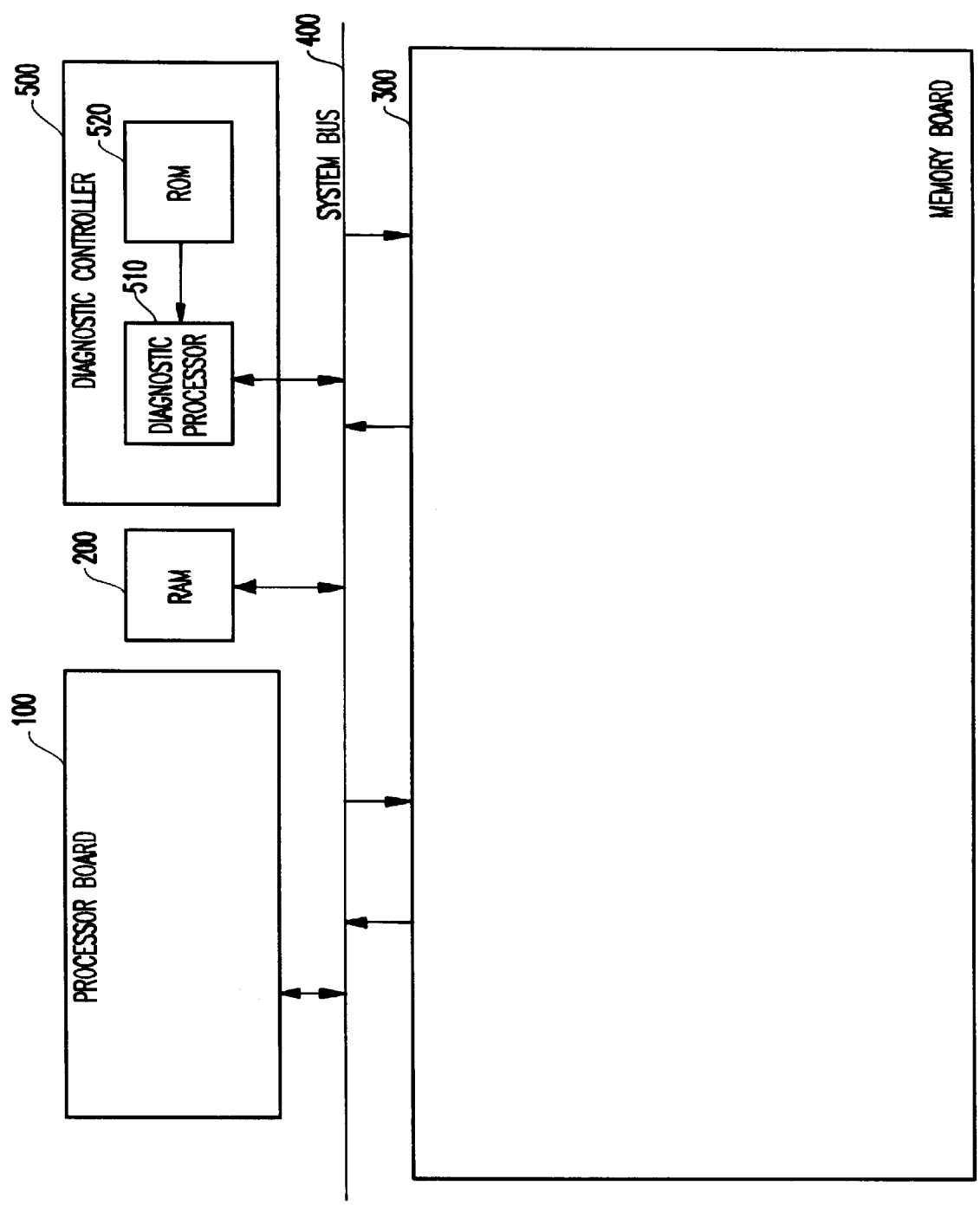
FIG. 7 is a block diagram showing the configuration of a computer system having a memory according to a second embodiment of the present invention.

Referring to FIG. 7, the computer system according to the second embodiment of the present invention is almost the same as that of the first embodiment except that a diagnostic controller 500 (as the processing unit) is connected to the system bus 400. The diagnostic controller 500 includes a diagnostic processor 510 for performing the error processing after the error detection and a ROM 520 for storing the various programs for the memory control.

The diagnostic controller 500 performs the operation of FIGS. 5 and 6 which has been explained as the first embodiment. At this stage, the programs stored in the ROM 520 can be used. The diagnostic controller 500 can be implemented with fewer components as compared with the processor board 100 in the first embodiment, and a fault rate is lowered.

According to the structure of the second embodiment, since the memory control unit is independently provided, a highly-reliable system can be formed.

As apparent from the above description, according to the present invention, the memory card on which the intermittent fault has occurred or the memory card having a high frequency of errors that are not fatal can be deleted (e.g., disconnected from the memory board 300), and system reliability can be thereby improved. Moreover, as to these memory cards, the fault(s) of these cards can be prevented from being subjected to recovery (e.g., error correction), thereby improving system performance.

While the invention has been described in terms of preferred embodiments, those skilled in the art will recognize that the invention can be practiced with modification within the spirit and scope of the appended claims.

What is claimed is:

1. A computer system, comprising:

at least one memory portion;

at least one memory controller for controlling access to at least said memory portion, said memory portion being connected to said memory controller;

a processing unit having a processor for deleting said memory portion which has at least one of an intermittent fault and a fault having a predetermined frequency; and an address decode register which decodes an address to identify at least said memory portion, said address decode register decoding said address by referring to information stored in said address decode register indicating a correspondence between said address and a memory portion number of said memory portion, wherein, when said at least one of an intermittent fault and a fault having a predetermined frequency occurs, said memory portion number in the information stored in said address decode register is changed to a number indicating that said memory portion has been deleted.

2. The computer system according to claim 1, wherein said fault comprises a non-fatal fault and wherein said processor determines whether the fault has a predetermined frequency according to at least one of a number of errors occurring and a time interval between a current error and a previous error.

3. The computer system according to claim 1, each of said at least one memory controller comprising:

an error detector for detecting an error caused by said at least one of an intermittent fault and a fault having a predetermined frequency in said memory portion.

4. The computer system according to claim 3, further comprising:

an error history information memory for storing error history information with respect to errors detected by said error detector, including the error caused by said at least one of an intermittent fault and a fault having a predetermined frequency in said memory portion.

5. The computer system according to claim 4, wherein said error history information includes an error occurrence time, a memory portion number, and an error status.

6. The computer system according to claim 4, wherein said error history information memory comprises a non-volatile memory.

7. The computer system according to claim 1, further comprising:

a memory installation information memory for storing memory installation information indicating whether at least said memory portion is installed;

said processor deleting said memory portion by updating the memory installation information in said memory installation information memory to indicate a non-installed state with respect to said memory portion, said address decode register changing said memory portion number in said stored information to said number indicating that said memory portion has been deleted in response to said updating.

8. The computer system according to claim 7, wherein said memory installation information memory comprises a non-volatile memory.

9. The computer system according to claim 3, further comprising:

a diagnostic controller having a diagnostic processor for deleting said at least one memory portion which has said at least one of said intermittent fault and said fault having said predetermined frequency.

10. The computer system according to claim 9, said diagnostic controller further comprising:

a program memory for storing a control program for said diagnostic processor.

11. The computer system according to claim 1, wherein said memory portion physically remains connected within the system in spite of said change indicating that said memory portion has been deleted.

12. A method of restructuring a memory in a computer system having at least one memory portion, at least one memory controller for controlling access to said at least one memory portion connected thereto, and an error history information memory for storing error history information, said method comprising:

detecting an error in one of said at least one memory portion;

storing error history information in said error history information memory corresponding to the error;

determining whether the error is due to at least of an intermittent fault and a fault having a predetermined frequency;

deleting said at least one memory portion which has at least one of said intermittent fault and said fault having said predetermined frequency; and maintaining, in an address register, information indicating a correspondence between said at least one memory portion and an address; and when said at least one of an intermittent fault having a predetermined frequency occurs, changing said information in said address decode register to indicate a correspondence between said at least one memory portion and data indicating that said at least one memory portion has been deleted.

13. The method according to claim 12, further comprising:

storing memory installation information in a memory installation information memory, said memory installation information indicating at least whether said at least one memory portion is installed; and updating said memory installation information in said memory installation information memory to indicate a non-installed state with respect to the memory portion when said at least one of said intermittent fault and said fault having a predetermined frequency occurs, said changing of said information being performed in response to updating said memory installation information.

* * * * *